United States Patent
Kang et al.

(10) Patent No.: US 12,341,045 B2
(45) Date of Patent: Jun. 24, 2025

(54) PARALLEL TRANSFER APPARATUS

(71) Applicant: Samsung Electronics Co., Ltd., Suwon-si (KR)

(72) Inventors: Hyunjae Kang, Suwon-si (KR); Sangmin Kim, Hwaseong-si (KR); Youngwook Kim, Seoul (KR); Chuljun Park, Seoul (KR); Jaesung Byun, Suwon-si (KR); Sangkyung Lee, Hwaseong-si (KR); Hyunwoo Lee, Hwaseong-si (KR); Junhyuk Chang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 17/981,685

(22) Filed: Nov. 7, 2022

(65) Prior Publication Data
US 2023/0154779 A1 May 18, 2023

(30) Foreign Application Priority Data
Nov. 17, 2021 (KR) .................. 10-2021-0158372

(51) Int. Cl.
*H01L 21/677* (2006.01)
*B65G 17/12* (2006.01)
*H01F 7/02* (2006.01)

(52) U.S. Cl.
CPC ........ *H01L 21/67766* (2013.01); *B65G 17/12* (2013.01); *H01F 7/02* (2013.01); *B65G 2201/0297* (2013.01)

(58) Field of Classification Search
CPC .......... H01F 7/02; H01F 7/0242; B60L 13/04; H02K 41/031; H02K 41/02; B65G 17/12; B65G 2201/0297; B65G 21/2009; H01L 21/67766

See application file for complete search history.

(56) References Cited

U.S. PATENT DOCUMENTS

| | | | |
|---|---|---|---|
| 6,206,683 | B1 | 3/2001 | Takahashi et al. |
| 6,353,199 | B1 | 3/2002 | Hosaka et al. |
| 7,478,706 | B2 | 1/2009 | Kocher et al. |
| 7,882,934 | B2 | 2/2011 | Kocher et al. |

(Continued)

FOREIGN PATENT DOCUMENTS

| | | |
|---|---|---|
| CN | 111547437 A | 8/2020 |
| JP | 3542272 B2 | 7/2004 |

(Continued)

*Primary Examiner* — Glenn F Myers
(74) *Attorney, Agent, or Firm* — Muir Patent Law, PLLC

(57) ABSTRACT

A transfer apparatus according to the disclosure includes a mast portion including a base portion, and a protrusion portion protruding from the base portion, and a plurality of shuttles configured to move along the mast portion, thereby transferring a carrier. The mast portion includes a first magnet track fixed to a first sidewall of the protrusion portion, and a second magnet track fixed to a second sidewall of the protrusion portion. Each of the plurality of shuttles includes a first coil portion adjacent to the first magnet track in a horizontal direction, and a second coil portion adjacent to the second magnet track in the horizontal direction. The protrusion portion, the first magnet track, and the second magnet track are disposed between the first and second coil portions.

18 Claims, 9 Drawing Sheets

(56) References Cited

U.S. PATENT DOCUMENTS

| | | | |
|---|---|---|---|
| 8,925,689 B2 | 1/2015 | Jacobs | |
| 10,968,079 B2 * | 4/2021 | Thum | B66B 5/044 |
| 2017/0225927 A1 | 8/2017 | Kirsch et al. | |
| 2018/0002142 A1 * | 1/2018 | Piech | H02K 41/031 |
| 2020/0039793 A1 * | 2/2020 | Weinberger | H02K 7/08 |
| 2021/0078830 A1 * | 3/2021 | Hakala | H02K 3/47 |
| 2022/0025717 A1 * | 1/2022 | Netecke | E21B 19/008 |

FOREIGN PATENT DOCUMENTS

| | | |
|---|---|---|
| JP | 2006036487 A | 2/2006 |
| KR | 1020110082183 A | 7/2011 |
| KR | 1020160065081 A | 6/2016 |

* cited by examiner

PARALLEL TRANSFER APPARATUS

CROSS-REFERENCE TO THE RELATED APPLICATION

This application claims priority under 35 U.S.C. § 119 from Korean Patent Application No. 10-2021-0158372, filed on Nov. 17, 2021, in the Korean Intellectual Property Office, the disclosure of which is incorporated herein by reference in its entirety.

BACKGROUND

1. Field

The exemplary embodiments of the disclosure relate to a transfer apparatus. In particular, the exemplary embodiments of the disclosure relate to a parallel transfer apparatus.

2. Description of the Related Art

In a process of processing a semiconductor substrate, a carrier, in which a plurality of substrates is received, is provided to a substrate processing apparatus, and is unloaded from the substrate processing apparatus. The carrier, which receives a plurality of substrates, may be, for example, a front opening unified pod (FOUP) or a front opening shipping box (FOSB).

Generally, such a carrier may be transferred by a transfer apparatus. The transfer apparatus may not only transfer a carrier, in which substrates before processing by a substrate processing apparatus are received, to provide the carrier to the substrate processing apparatus, but also may transfer a carrier, in which substrates having been processed by the substrate processing apparatus are received, to unload the carrier from the substrate processing apparatus.

SUMMARY

The exemplary embodiments of the disclosure achieve an enhancement in transfer speed and installation space efficiency of a transfer apparatus.

A transfer apparatus according to some exemplary embodiments of the disclosure may include a mast portion including a base portion, a protrusion portion protruding from the base portion, and a plurality of shuttles configured to move along the mast portion, thereby transferring a carrier. The mast portion may include a first magnet track fixed to a first sidewall of the protrusion portion, and a second magnet track fixed to a second sidewall of the protrusion portion. Each of the plurality of shuttles may include a first coil portion adjacent to the first magnet track in a horizontal direction, and a second coil portion adjacent to the second magnet track in the horizontal direction. The protrusion portion, the first magnet track, and the second magnet track may be disposed between the first and second coil portions.

A transfer apparatus according to some exemplary embodiments of the disclosure may include a mast portion, a first shuttle and a second shuttle configured to move along the mast portion, thereby transferring a carrier, a first belt coupled to the first shuttle, to move together with the first shuttle, and a second belt coupled to the second shuttle while extending through the first shuttle, to move together with the second shuttle. The first shuttle may include a belt through hole through which the second belt extends.

A transfer apparatus according to some exemplary embodiments of the disclosure may include a mast portion including a base portion, a protrusion portion protruding from a first sidewall of the base portion, a first shuttle and a second shuttle configured to move along the first sidewall of the base portion, thereby transferring a carrier, a first counterweight and a second counterweight configured to move a second sidewall of the base portion, a first belt interconnecting the first shuttle and the first counterweight, and a second belt interconnecting the second shuttle and the second counterweight. The first and second shuttles may overlap each other in a vertical direction. The first and second counterweights may be spaced apart from each other in a horizontal direction.

DETAILED DESCRIPTION

Example embodiments will be more clearly understood from the following detailed description taken in conjunction with the accompanying drawings, in which like numerals refer to like elements throughout.

Figure 1:
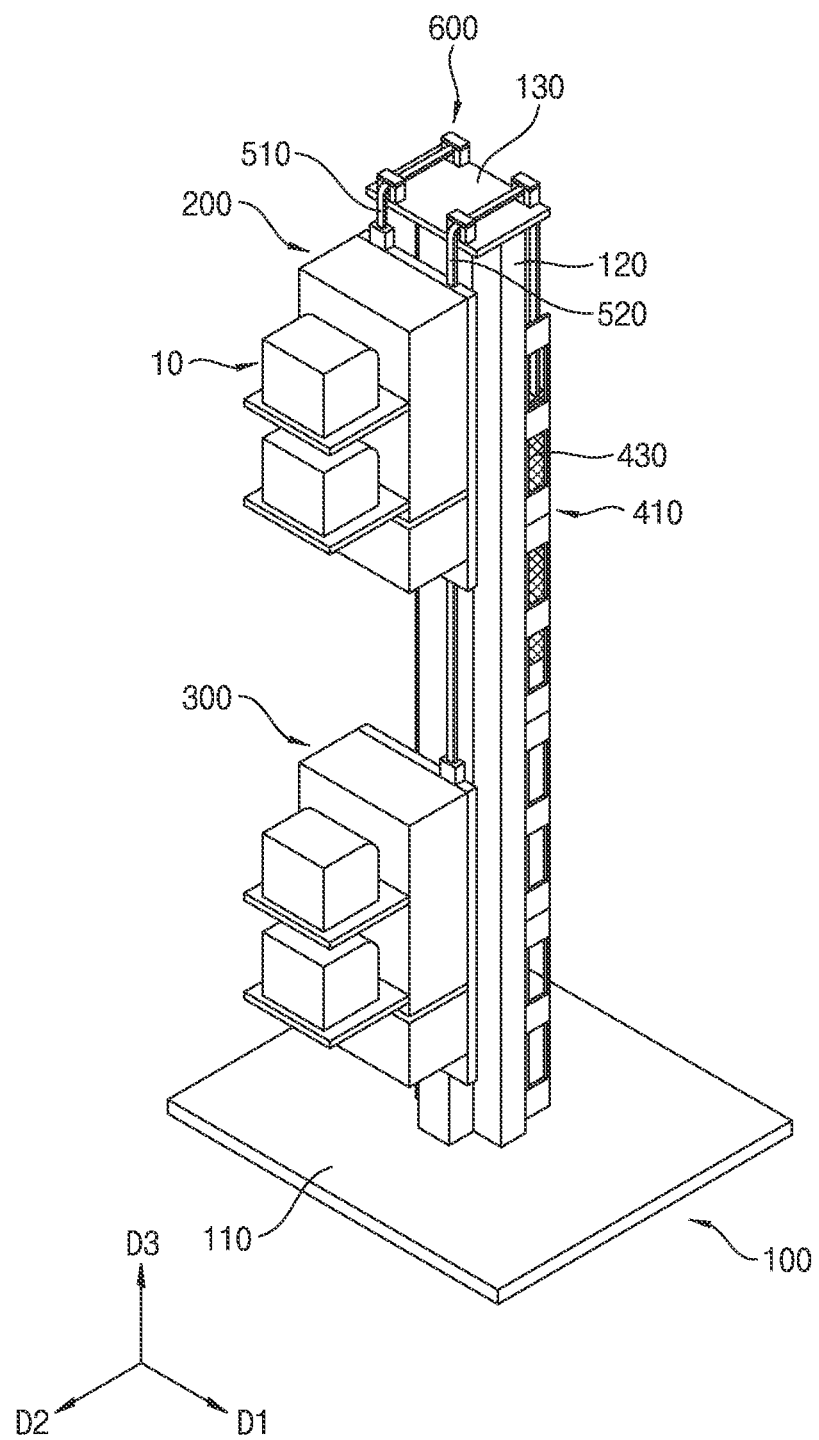
FIGS. 1 and 2 are perspective views schematically showing a transfer apparatus according to some exemplary embodiments of the disclosure.
Figure 2:
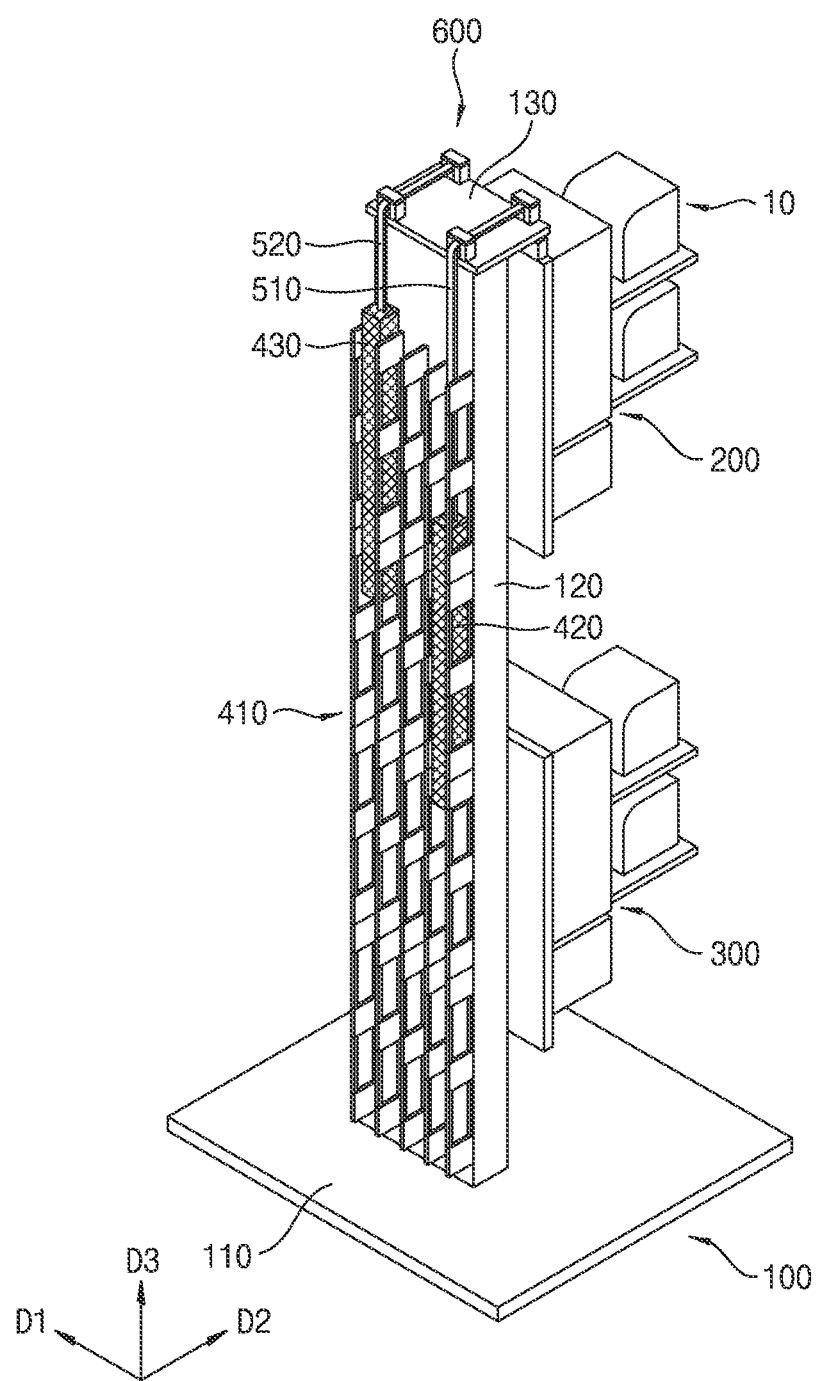

FIGS. 1 and 2 are perspective views schematically showing a transfer apparatus according to some exemplary embodiments of the disclosure.

Referring to FIGS. 1 and 2, the transfer apparatus according to the exemplary embodiments of the disclosure may include a mast frame 100.

The mast frame 100 may include a mast support portion 110 and a mast portion 120. The mast portion 120 may be provided on the mast support portion 110. The mast portion 120 may be attached to the mast support portion 110. The mast support portion 110 may have the form of a plate extending along a plane defined by a first direction D1 and a second direction D2. The first direction D1 and the second direction D2 may intersect each other. For example, the first direction D1 and the second direction D2 may be horizontal directions perpendicularly intersecting each other. The mast support portion 110 may support the mast portion 120. The mast portion 120 may extend in a third direction D3. The third direction D3 may intersect the first direction D1 and the second direction D2. For example, the third direction D3 may be a vertical direction perpendicularly intersecting the first direction D1 and the second direction D2.

The mast frame 100 may further include a pulley support portion 130. The pulley support portion 130 may be provided on the mast portion 120. The pulley support portion 130 may have the form of a plate extending along a plane defined by the first direction D1 and the second direction D2.

A first shuttle 200 and a second shuttle 300 may be provided. The first shuttle 200 and the second shuttle 300 may be vertically movable along the mast portion 120 of the mast frame 100. The first shuttle 200 and the second shuttle 300 may move in the third direction D3 and in a direction reverse to the third direction D3. The first and second shuttles 200 and 300 may overlap each other in the third direction D3. The first and second shuttles 200 and 300 may be arranged along the mast portion 120. In the exemplary embodiments of the disclosure, the number of the shuttles 200 and 300 is not limited to two. In some embodiments, the number of shuttles 200 and 300 may be three or more.

A rail structure 410 connected to the mast portion 120 of the mast frame 100 may be provided. A first counterweight 420 and a second counterweight 430, which vertically move along the mast portion 120 of the mast frame 100, may be provided. The first counterweight 420 may function to reduce a force required for vertical movement of the first shuttle 200. The second counterweight 430 may function to reduce a force required for vertical movement of the second shuttle 300. The first counterweight 420 and the second counterweight 430 may move in the third direction D3 and in a direction reverse to the third direction D3. The rail structure 410 may define paths along which the first and second counterweights 420 and 430 move. The first and second counterweights 420 and 430 may move along the paths defined by the rail structure 410. For example, the first and second counterweights 420 and 430 may move within the vertical paths defined by the rail structure 410. The first and second counterweights 420 and 430 may be spaced apart from each other in the first direction D1.

The number of the counterweights 420 and 430 may be equal to the number of the shuttles 200 and 300. In the exemplary embodiments of the disclosure, the number of the counterweights 420 and 430 is not limited to two. In some embodiments, the number of counterweights 420 and 430 may be three or more.

A first belt 510 interconnecting the first shuttle 200 and the first counterweight 420 may be provided. A second belt 520 interconnecting the second shuttle 300 and the second counterweight 430 may be provided. The first shuttle 200, the first counterweight 420, and the first belt 510 may be coupled together to move together. For example, when the first shuttle 200 moves upwards, the first counterweight 420 may move downwards. The second shuttle 300, the second counterweight 430, and the second belt 520 may be coupled together to move together. For example, when the second shuttle 300 moves upwards, the second counterweight 430 may move downwards. The second belt 520 may extend through the first shuttle 200. A portion of the second belt 520 may be surrounded by the first shuttle 200. The second belt 520 and the first shuttle 200 may move independently of one another.

Belt-pulley structures 600 may be provided on the pulley support portion 130 of the mast frame 100. The belt-pulley structures 600 may support the first and second belts 510 and 520. In some embodiments, the belt-pulley structures 600 may surround each of the first and second belts 510 and 520, and the first and second belts 510 and 520 may move through the belt-pulley structures 600. Each of the first and second belts 510 and 520 may be supported by two belt-pulley structures 600. The first belt 510 may move on the belt-pulley structures 600 such that the first shuttle 200 and the first counterweight 420 may vertically move. The second belt 520 may move on the belt-pulley structures 600 such that the second shuttle 300 and the second counterweight 430 may vertically move.

In the transfer apparatus according to the exemplary embodiments of the disclosure, carriers 10 disposed at the first and second shuttles 200 and 300 may be transferred upwards and downwards in accordance with vertical movement of the first and second shuttles 200 and 300. The carriers 10 may be transferred from one floor to another floor by the transfer apparatus.

Figure 3:
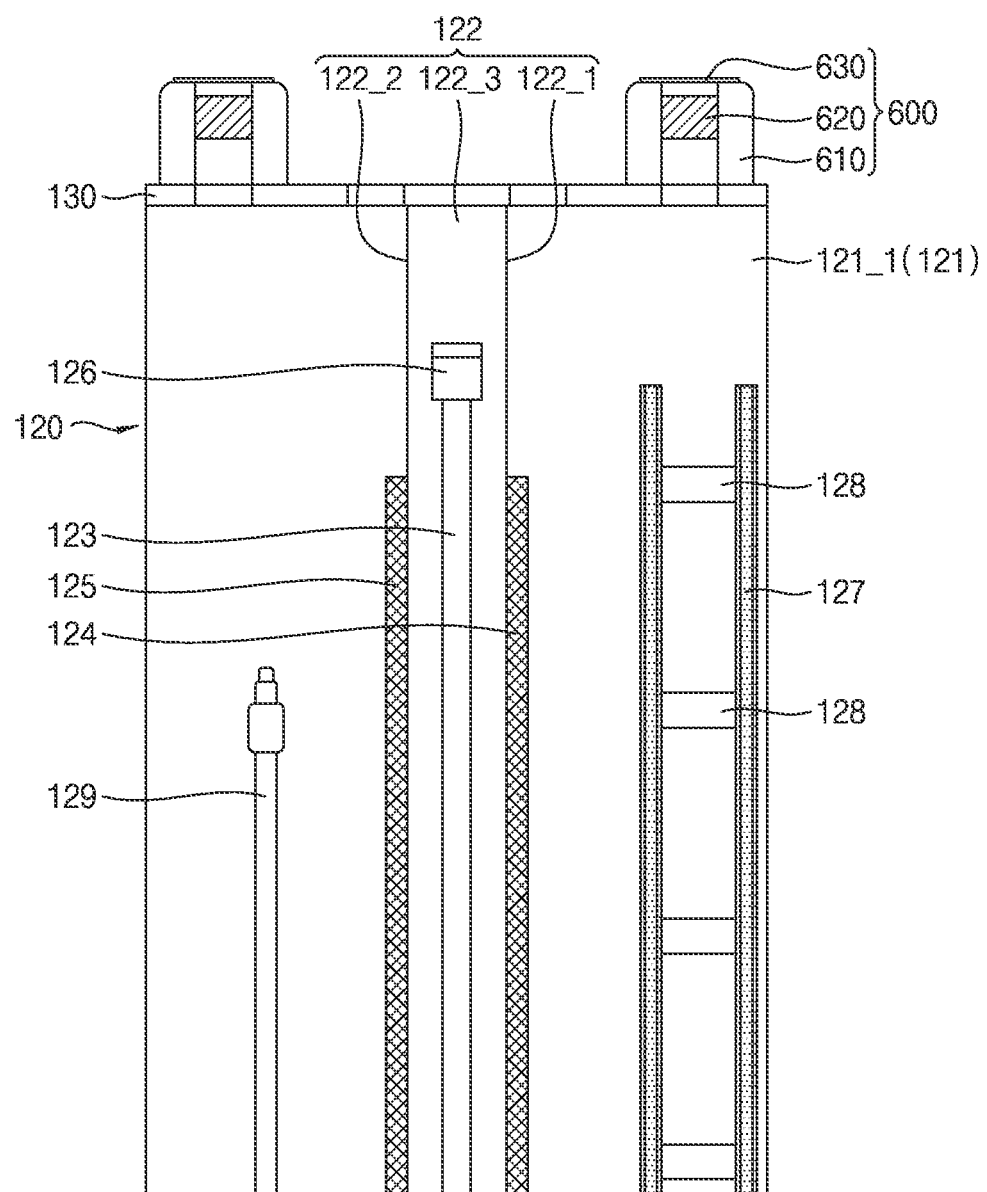
FIG. 3 is a view explaining a mast portion and a belt-pulley structure of the transfer apparatus according to FIGS. 1 and 2.
Figure 4:
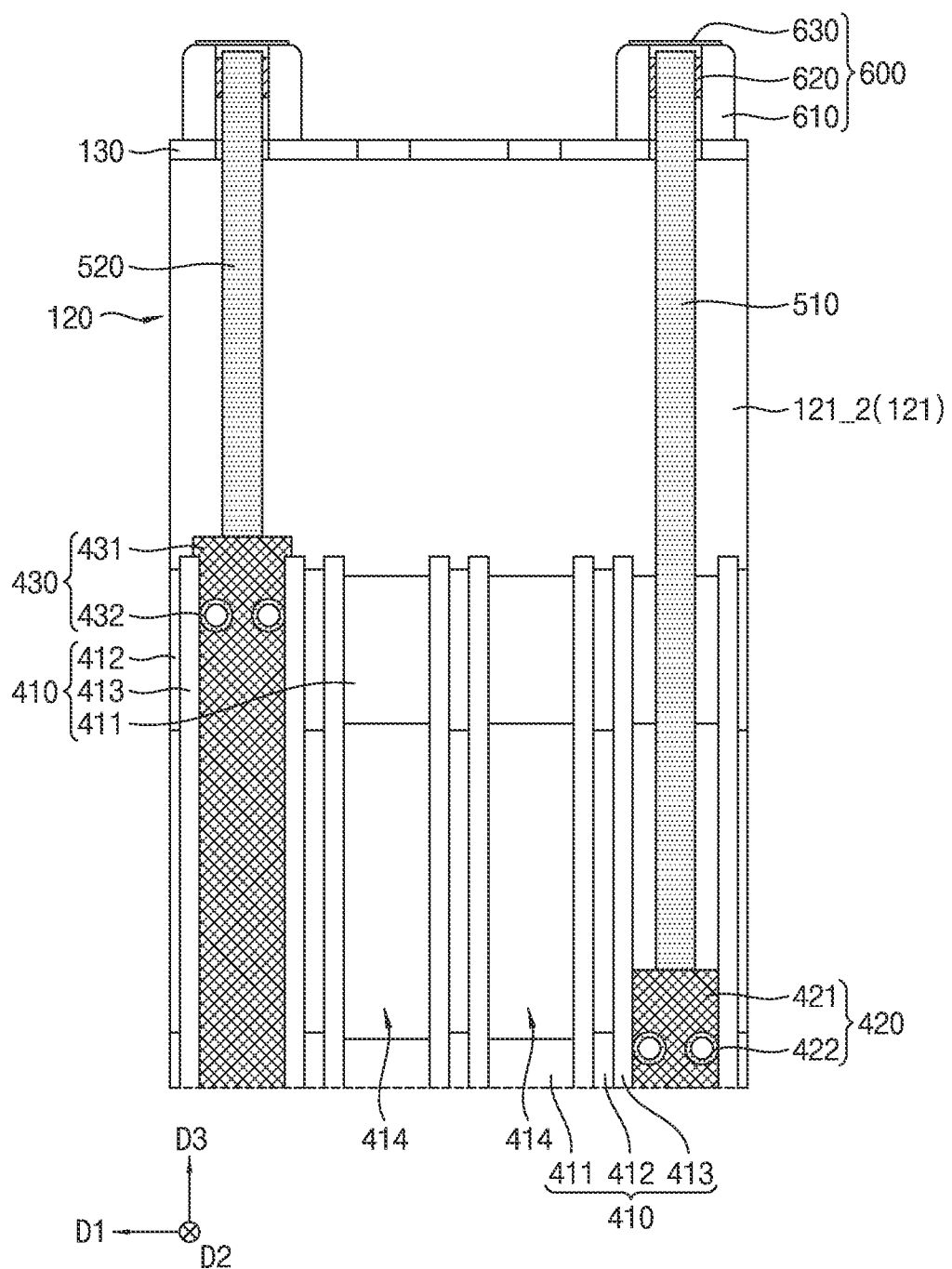
FIG. 4 is a view explaining a rail structure and counterweights of the transfer apparatus according to FIGS. 1 and 2.
Figure 5:
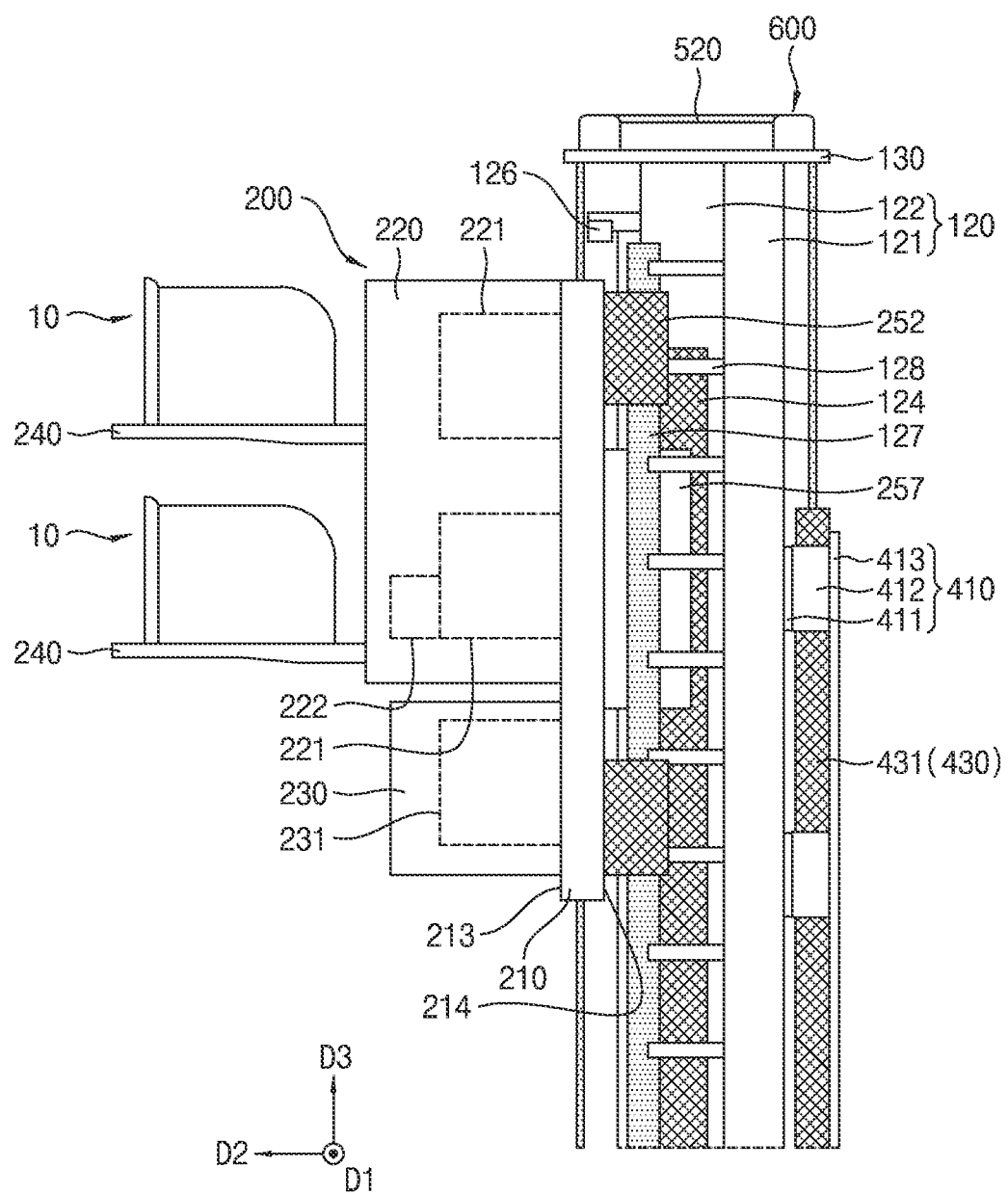
FIG. 5 is a side view of the transfer apparatus according to FIGS. 1 and 2.

FIG. 3 is a view explaining the mast portion and the belt-pulley structure of the transfer apparatus according to FIGS. 1 and 2. FIG. 4 is a view explaining the rail structure and the counterweights of the transfer apparatus according to FIGS. 1 and 2. FIG. 5 is a side view of the transfer apparatus according to FIGS. 1 and 2. For convenience of description, the belts and the shuttles are omitted from FIG. 3.

Referring to FIG. 3, the mast portion 120 of the mast frame 100 may include a base portion 121 and a protrusion portion 122. The base portion 121 and the protrusion portion 122 of the mast portion 120 may extend lengthwise in the third direction D3. The protrusion portion 122 may protrude from a first sidewall 121_1 of the base portion 121. The protrusion portion 122 may include a first sidewall 122_1, a second sidewall 122_2, and a third sidewall 122_3. The third sidewall 122_3 of the protrusion portion 122 may be parallel to the first sidewall 121_1 of the base portion 121. The first sidewall 122_1 of the protrusion portion 122 may be connected to the third sidewall 122_3 of the protrusion portion 122 and the first sidewall 121_1 of the base portion 121. The second sidewall 122_2 of the protrusion 122 may be connected to the third sidewall 122_3 of the protrusion portion 122 and the first sidewall 121_1 of the base portion 121. The first sidewall 122_1 and the second sidewall 122_2 of the protrusion portion 122 may be parallel to each other. The first sidewall 122_1 and the second sidewall 122_2 of the protrusion portion 122 may be sidewalls opposing each other. The first and second shuttles 200 and 300 may vertically move along the first sidewall 121_1 of the base portion 121 and the protrusion portion 122.

The mast portion 120 of the mast frame 100 may further include a guide 123, a first magnet track 124, a second magnet track 125, and a bumper 126. The guide 123 may be fixed to the third sidewall 122_3 of the protrusion portion 122 of the mast portion 120. The guide 123 may guide vertical movement of the first and second shuttles 200 and 300. The first and second shuttles 200 and 300 may move along the guide 123. The guide 123 may extend lengthwise in the third direction D3.

The first magnet track 124 may be fixed to the first sidewall 122_1 of the protrusion portion 122. The second magnet track 125 may be fixed to the second sidewall 122_2 of the protrusion portion 122. The first and second magnet tracks 124 and 125 may be parallel to each other. The first and second magnet tracks 124 and 125 may be disposed at opposite sides of the protrusion portion 122. The first and second magnet tracks 124 and 125 may extend lengthwise in the third direction D3. Each of the first and second magnet tracks 124 and 125 may include a magnet. Each of the first and second magnet tracks 124 and 125 may be a constituent element of a linear motor configured to drive the first and second shuttles 200 and 300. The first and second magnet tracks 124 and 125 may be spaced apart from each other in the first direction D1. The protrusion portion 122 may be disposed between the first and second magnet tracks 124 and 125. The guide 123 may be disposed between the first and second magnet tracks 124 and 125.

The bumper 126 may be connected to an upper end of the guide 123. The bumper 126 may be provided on the third sidewall 122_3 of the protrusion portion 122. The bumper 126 may define a movement limit of the first shuttle 200 moving along the guide 123. The bumper 126 may be disposed on a movement path of the first shuttle 200 and, as such, upward movement of the first shuttle 200 beyond the bumper 126 may be limited. Although not shown, a bumper may be connected to a lower end of the guide 123, similarly to the bumper 126 connected to the upper end of the guide 123. The bumper connected to the lower end of the guide 123 may define a movement limit of the second shuttle 300.

The mast portion 120 of the mast frame 100 may further include a communication antenna 129, power cables 127, and power cable supports 128. The communication antenna 129 may communicate with the first and second shuttles 200 and 300 in a wireless manner. The communication antenna 129 may transmit and receive radio signals with the first and second shuttles 200 and 300. The communication antenna 129 may extend lengthwise in the third direction D3. The communication antenna 129 may be provided on the first sidewall 121_1 of the base portion 121.

The power cable supporters 128 may support the power cables 127. The power cable supports 128 may be arranged in the third direction D3. For example, the power cable supports 128 may be arranged to be parallel to one another in the third direction D3. The power cables 127 may be disposed at opposite sides of the power cable support 128. The power cable supports 128 may be provided on the first sidewall 121_1 of the base portion 121.

The power cables 127 may supply electric power to the first and second shuttles 200 and 300. In some embodiments, the power cables 127 may supply electric power to the first and second shuttles 200 and 300 in a wireless manner. The power cables 127 may extend lengthwise in the third direction D3. A plurality of power cable supports 128 may support one power cable 127.

Each of the belt-pulley structures 600 on the pulley support portion 130 may include belt-pulley supports 610, a belt pulley 620, and a cover 630. The belt-pulley supports 610 may be provided on the pulley support portion 130. Two belt-pulley supports 610 may support one belt pulley 620. The belt-pulley supports 610 may be disposed at opposite sides of the belt pulley 620.

The belt pulleys 620 may support the first and second belts 510 and 520. The belt pulleys 620 may rotate in accordance with movement of the first and second belts 510 and 520. The belt pulleys 620 may be rotatably connected to the belt-pulley supports 610.

The cover 630 may be provided on the belt-pulley supports 610. The cover 630 may interconnect two belt-pulley supports 610.

Referring to FIGS. 4 and 5, the rail structure 410 may include fixed plates 411, rail supports 412, and rails 413. The fixed plates 411 may be provided on the second sidewall 121_2 of the base portion 121. The second sidewall 121_2 of the base portion 121 may be a sidewall opposing the first sidewall 121_1 of the base portion 121. The first and second counterweights 420 and 430 may vertically move along the second sidewall 121_2 of the base portion 121. The fixed plates 411 may extend lengthwise in the first direction D1. The fixed plates 411 may be arranged in the third direction D3. For example, the fixed plates 411 may be arranged to be parallel to one another in the third direction D3.

The rail supports 412 may be disposed on the fixed plates 411. A plurality of rail supports 412 may be connected to one fixed plate 411. The plurality of rail supports 412 connected to one fixed plate 411 may be arranged in the first direction D1. For example, the plurality of rail supports 412 connected to one fixed plate 411 may be arranged to be parallel to one another in the third direction D3. The rail supports 412 may protrude from a sidewall of the fixed plate 411 in a direction reverse to the second direction D2.

One rail 413 may be connected to a plurality of rail supports 412. The plurality of rail supports 412 connected to one rail 413 may be arranged in the third direction D3. The rail 413 may extend lengthwise in the third direction D3. Opposite sides of the rail support 412 may be connected to the fixed plate 411 and the rail 413, respectively. The rail support 412 may be disposed between the fixed plate 411 and the rail 413.

Weight movement paths 414 may be defined by the rail structure 410. The weight movement paths 414 may extend in the third direction D3. Each of the weight movement paths 414 may be defined by the fixed plates 411, the rail supports 412, and the rails 413 of the rail structure 410. The weight movement path 414 may be a space defined between the fixed plate 411 and the rails 413 spaced apart from each other in the second direction D2. The weight movement path 414 may be a space defined between the rails 413 spaced apart from each other in the first direction D1. The weight movement path 414 may be a space defined between the rail supports 412 spaced apart from each other in the first direction D1. In the exemplary embodiments of the disclosure, the number of weight movement paths 414 defined by the rail structure 410 may be four, without being limited thereto. In some embodiments, the number of weight movement paths 414 may be three or less, or five or more.

Each of the first and second counterweights 420 and 430 may move along the weight movement path 414 defined by the rail structure 410. Movement in the horizontal direction of each of the first and second counterweights 420 and 430 may be restricted by the fixed plates 411, the rail supports 412, and the rails 413 of the rail structure 410. Each of the first and second counterweights 420 and 430 may be disposed between the rail supports 412 spaced apart from each other in the first direction D1. For example, the rail supports 412 may be provided on opposite outer sidewalls of each of the first and second counterweights 420 and 430. Each of the first and second counterweights 420 and 430 may be disposed between the fixed plate 411 and the rails 413 spaced apart from each other in the second direction D2. For example, the fixed plate 411 and the rails 413 may be provided on front and back sides, respectively, of each of the first and second counterweights 420 and 430. The first and second counterweights 420 and 430 may be disposed in a part of the weight movement paths 414, and may not be disposed in another part of the weight movement paths 414.

The first and second counterweights 420 and 430 may include respective bodies 421 and 431, and respective rail rollers 422 and 432. The rails 413 may be disposed to face outer sidewalls of respective bodies 421 and 431 of the first and second counterweights 420 and 430 and, as such, may restrict horizontal movement of the first and second counterweights 420 and 430. The rail rollers 422 and 432 may be disposed on the outer sidewalls of the bodies 421 and 431, respectively. When the first and second counterweights 420 and 430 move, the rail rollers 422 and 432 may rotate along the rails 413. The rail rollers 422 and 432 may contact the rails 413.

The first belt 510 may be coupled to an upper end of the body 421 of the first counterweight 420. The second belt 520 may be coupled to an upper end of the body 431 of the second counterweight 430.

Referring to FIG. 5, the first shuttle 200 may include a shuttle frame 210, a first electronic device case 220, a second electronic device case 230, and bedplates 240.

The shuttle frame 210 may be connected to the first belt 510. The first and second electronic device cases 220 and 230 may be disposed on a first sidewall 213 of the shuttle frame 210. The first and second electronic device cases 220 and 230 may include electronic devices. In some embodiments, the first and second electronic device cases 220 and 230 may include regulators 221 and 231, respectively. The regulators 221 and 231 may be, for example, constituent elements for driving of the first shuttle 200. In some embodiments, the first electronic device case 220 may include a communication module 222. The communication module 222 may have a wireless communication function. The communication module 222 may communicate with the communication antenna 129 in a wireless manner. Each of the first and second electronic device cases 220 and 230 may include an empty space therein.

The bedplates 240 may be connected to a sidewall of the first electronic device case 220. Each of the bedplates 240 may support a carrier 10 in which substrates are received. In accordance with vertical movement of the first shuttle 200, carriers 10 disposed on the bedplates 240 may be transferred upwards and downwards. The carrier 10 may be transferred from the outside to the bedplate 240, and may be transferred from the bedplate 240 to the outside.

Figure 6:
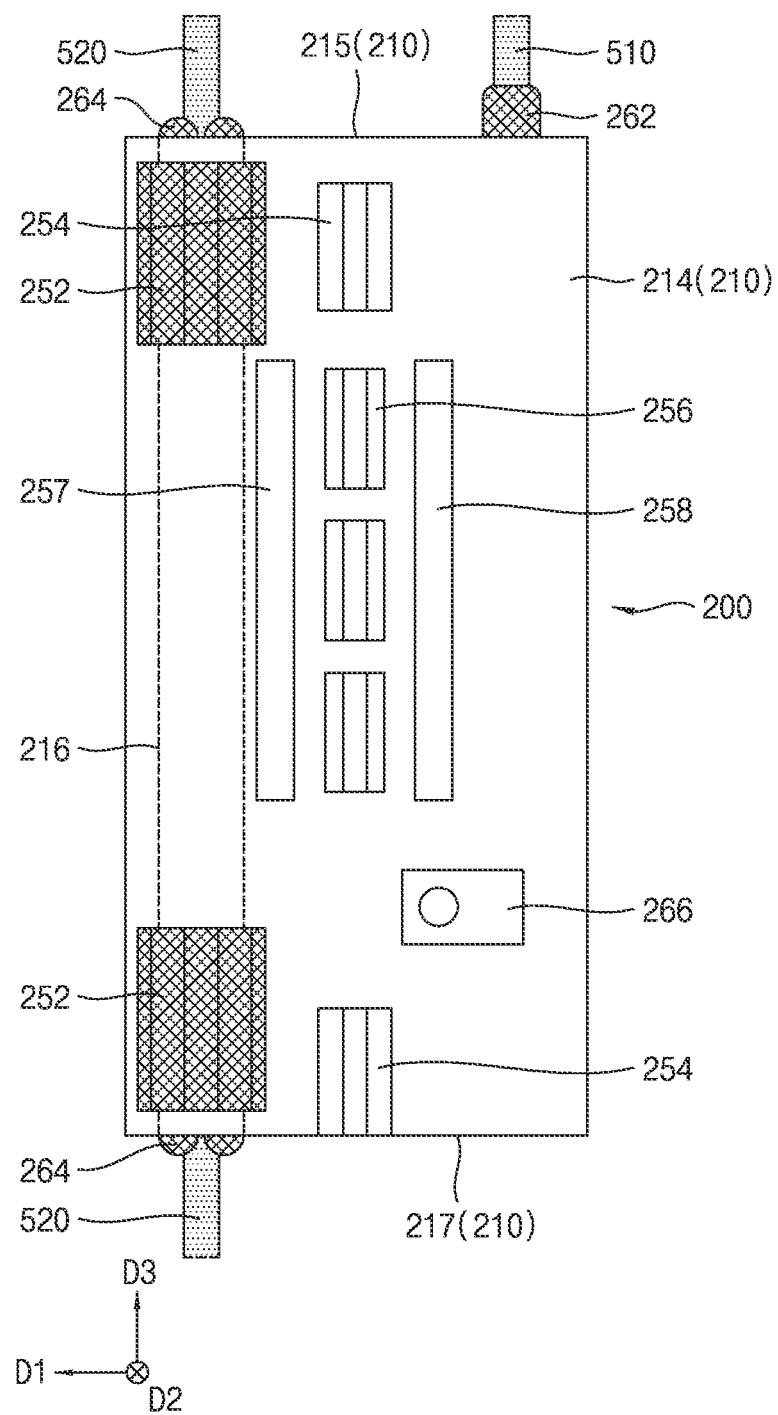
FIG. 6 is a view explaining a first shuttle of the transfer apparatus according to FIGS. 1 and 2.
Figure 7:
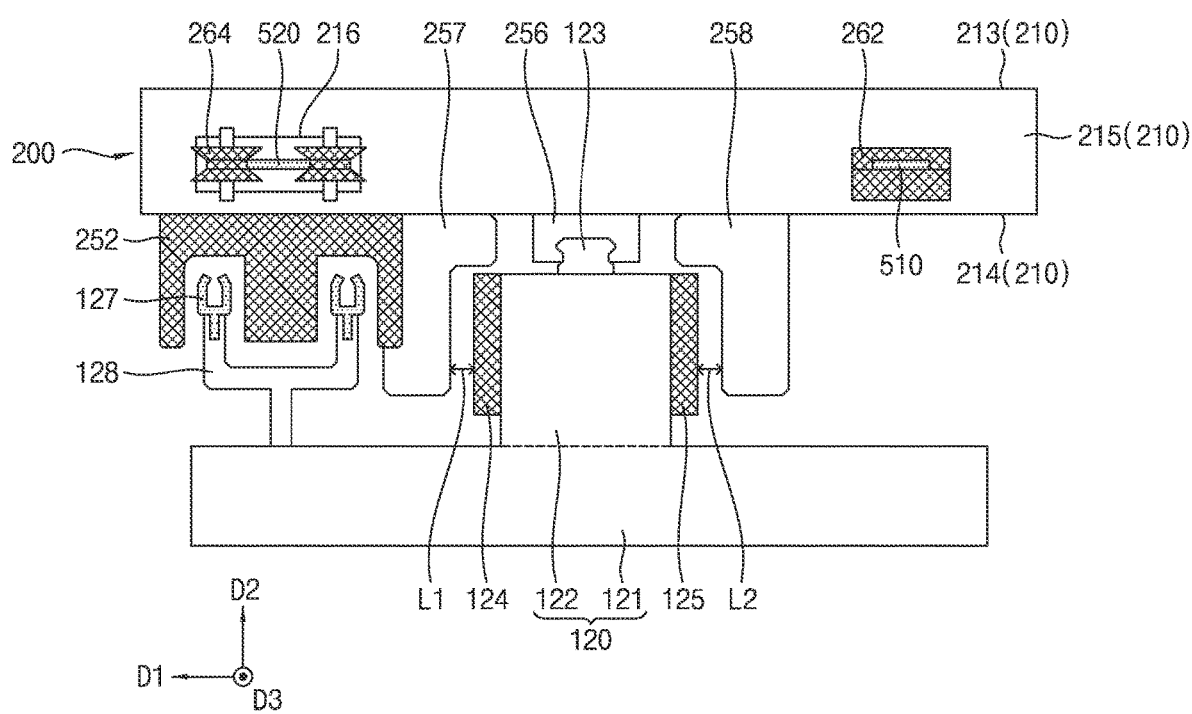
FIG. 7 is a view explaining the relation between the first shuttle and the mast portion in the transfer apparatus according to FIGS. 1 and 2.
Figure 8:
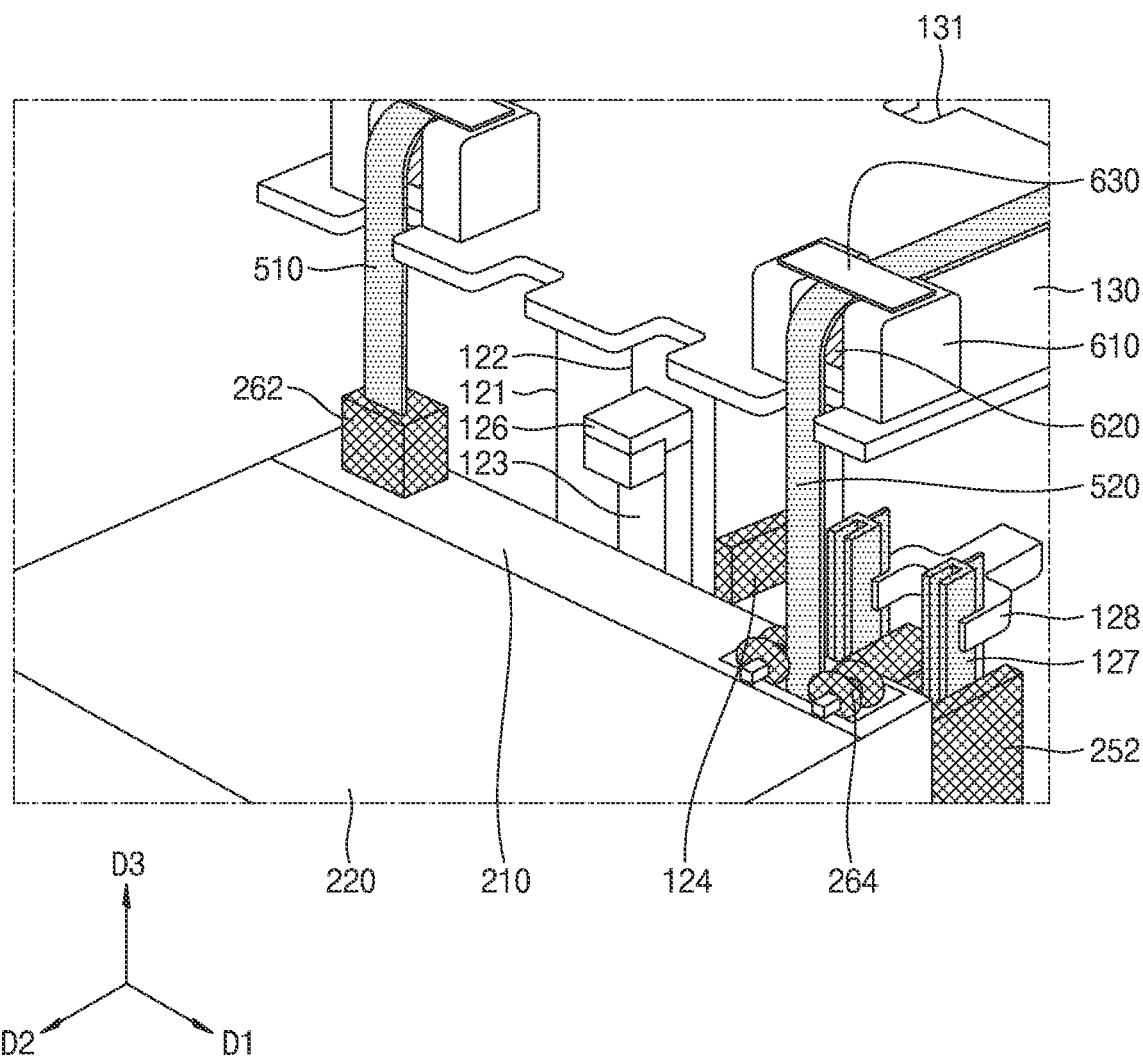
FIG. 8 is an enlarged perspective view of an upper portion of the transfer apparatus according to FIGS. 1 and 2.
Figure 9:
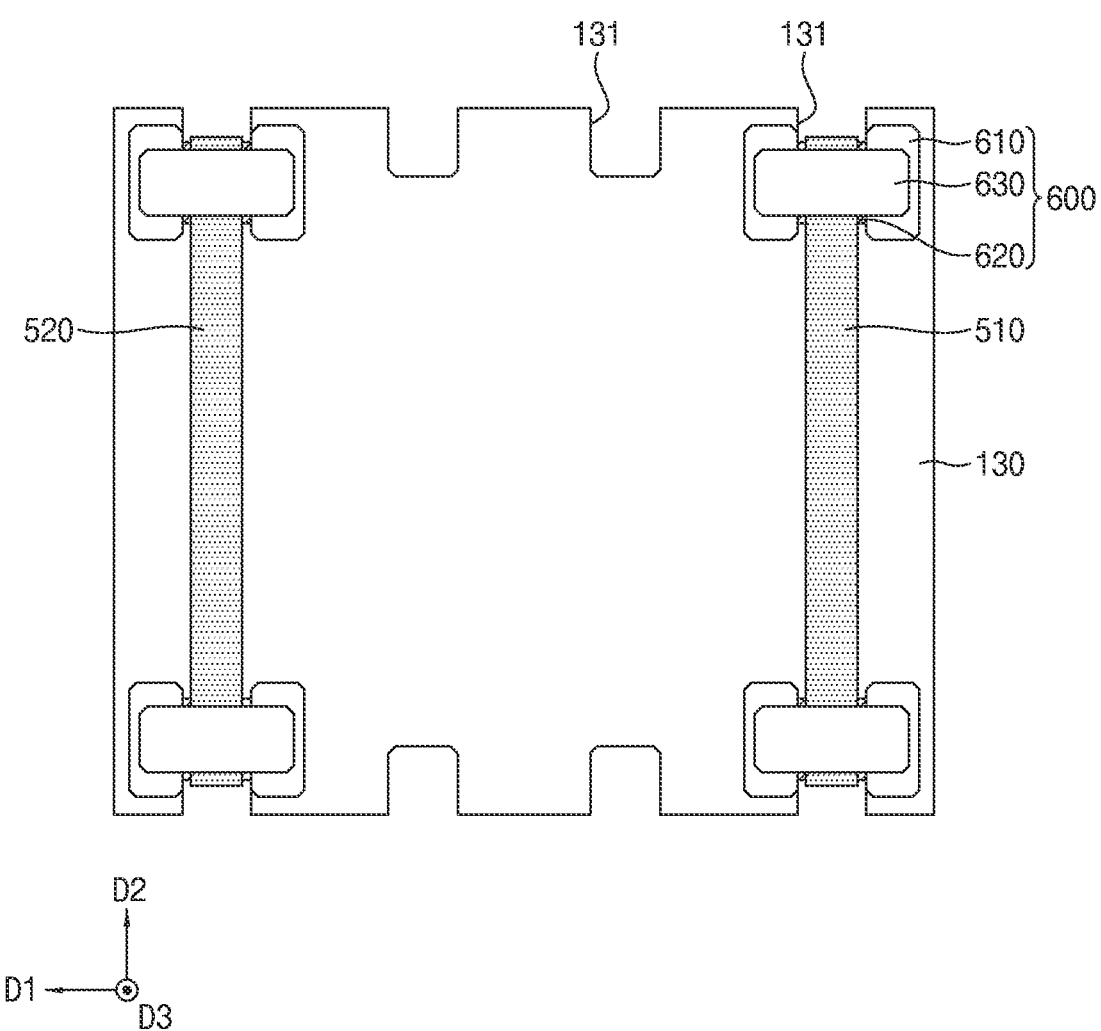
FIG. 9 is a view explaining a pulley support portion and a belt-pulley structure in the transfer apparatus according to FIGS. 1 and 2.

FIG. 6 is a view explaining the first shuttle of the transfer apparatus according to FIGS. 1 and 2. FIG. 7 is a view explaining the relation between the first shuttle and the mast portion in the transfer apparatus according to FIGS. 1 and 2. FIG. 8 is an enlarged perspective view of an upper portion of the transfer apparatus according to FIGS. 1 and 2. FIG. 9 is a view explaining the pulley support portion and the belt-pulley structure in the transfer apparatus according to FIGS. 1 and 2.

Referring to FIGS. 5, 6, 7, and 8, the first shuttle 200 may include pick-up portions 252, guide clamps 254, guide blocks 256, a first coil portion 257, a second coil portion 258, a belt clamp 262, belt guide rollers 264, and a braking portion 266 which are connected to the shuttle frame 210.

The pick-up portions 252, the guide clamps 254, the guide blocks 256, the first and second coil portions 257 and 258, and the braking portion 266 may be fixed to a second sidewall 214 of the shuttle frame 210. The second sidewall 214 of the shuttle frame 210 may be a sidewall opposing the first sidewall 213 of the shuttle frame 210. The second sidewall 214 of the shuttle frame 210 may face the mast portion 120.

The pick-up portions 252 may be disposed adjacent to the power cables 127. The pick-up portions 252 may overlap with the power cables 127 in the second direction D2. The pick-up portions 252 may receive electric power required for driving of the first shuttle 200 from the power cables 127 in a wireless manner. In some embodiments, the pick-up portions 252 and the power cables 127 may constitute a non-contact power supply device (HID). The pick-up portions 252 may be spaced apart from each other in the third direction D3.

The guide clamps 254 may be disposed adjacent to the guide 123. The guide clamps 254 may overlap with the guide 123 in the second direction D2. The guide clamps 254 may clamp the guide 123. When the guide clamps 254 clamp the guide 123, movement of the first shuttle 200 may be restricted, whereas, when the guide clamps 254 release clamping of the guide 123, movement restriction of the first shuttle 200 may be released. The guide clamps 254 may be spaced apart from each other in the third direction D3.

The guide blocks 256 may be disposed adjacent to the guide 123. The guide blocks 256 may overlap with the guide 123 in the second direction D2. The guide blocks 256 may engage with the guide 123 to allow the first shuttle 200 to move along the guide 123. In accordance with movement of the first shuttle 200, the guide blocks 256 may slide on the guide 123. Accordingly, the first shuttle 200 may move in the third direction D3 or in a direction reverse to the third direction D3 while maintaining a predetermined distance from the mast portion 120. As the guide blocks 256 engage with the guide 123, movement in the horizontal direction of the first shuttle 2000 may be restricted. The guide blocks 256 may be arranged in the third direction D3. The guide blocks 256 may be disposed between the guide clamps 254.

The first and second coil portions 257 and 258 may extend lengthwise in the third direction D3. The first coil portion 257 may be disposed adjacent to the first magnet track 124. For example, the first coil portion 257 may be adjacent to the first magnet track 124 in the horizontal direction. The first coil portion 257 may be spaced apart from the first magnet track 124 in the first direction D1. The second coil portion 258 may be adjacent to the second magnet track 125. For example, the second coil portion 258 may be adjacent to the second magnet track 125 in the horizontal direction. The second coil portion 258 may be spaced apart from the second magnet track 125 in the first direction D1. The first and second magnet tracks 124 and 125, the protrusion portion 122, the guide 123, and the guide blocks 256 may be disposed between the first and second coil portions 257 and 258.

The first coil portion 257 and the first magnet track 124 may constitute one linear motor, and the second coil portion 258 and the second magnet track 125 may constitute one linear motor. The first shuttle 200 may be driven by two linear motors spaced apart from each other in the first direction D1. Each of the first and second coil portions 257 and 258 may include an electromagnetic coil. When current flows through the electromagnetic coils of the first and second coil portions 257 and 258, the linear motors may be driven and, as such, the first shuttle 200 may move vertically.

The distance between the first coil portion 257 and the first magnet track 124 spaced apart from each other in the first direction D1, may be defined as a first distance L1. The distance between the second coil portion 258 and the second magnet track 125 spaced apart from each other in the first direction D1 may be defined as a second distance L2. As two linear motors are symmetrically disposed at opposite sides of the protrusion portion 122, attractive forces generated by the linear motors may offset each other. Accordingly, the first distance L1 and the second distance L2 may be maintained to be constant during vertical movement of the first shuttle 200. For example, the first distance L1 and the second distance L2 may be maintained at 0.5 mm.

In the transfer apparatus according to the exemplary embodiments of the disclosure, the distance between a coil portion and a magnet track may be maintained to be constant during vertical movement of a shuttle and, as such, stability of vertical movement of the shuttle may be enhanced. As stability of vertical movement of the shuttle is enhanced, the vertical movement speed of the shuttle may become relatively high.

Referring to FIGS. 6, 7, and 8, the belt clamp 262 may be provided on a top surface 215 of the shuttle frame 210. The belt clamp 262 may clamp the first belt 510. The first shuttle 200 may be coupled to the first belt 510 by the belt clamp 262. As the belt clamp 262 couples the first shuttle 200 to the first belt 510, the first shuttle 200 may move together with the first belt 510.

The shuttle frame 210 may include a belt through hole 216. The belt through hole 216 may extend through the shuttle frame 210 in the third direction D3. The belt through hole 216 may be an empty space extending in the third direction D3. The belt through hole 216 may extend through the top surface 215 of the shuttle frame 210 and a bottom surface 217 of the shuttle frame 210.

The belt guide rollers 264 may guide the second belt 520. The belt guide rollers 264 may be disposed adjacent to the top surface 215 and the bottom surface 217 of the shuttle frame 210. The belt guide rollers 264 may overlap with the belt through hole 216. The belt guide rollers 264 may guide the second belt 520 to extend through the belt through hole 216. A portion of the second belt 520 may be disposed in the belt through hole 216 and be surrounded by the shuttle frame 210. When the second belt 520 moves, the belt guide rollers 264, which contact the second belt 520, may rotate. The first shuttle 200 may not be influenced by movement of the second belt 520 by virtue of the belt guide rollers 264.

In the exemplary embodiments of the disclosure, the number of belt through holes 216 included in the first shuttle 200 is not limited to one. In some embodiments, the first shuttle 200 may include two or more belt through holes. In this case, the belt guide rollers may be configured to correspond to the belt through holes.

In the transfer apparatus according to the exemplary embodiments of the disclosure, the second belt 520 may be connected to the second shuttle 300 while extending through the belt through hole 216 of the first shuttle 200 and, as such, the first shuttle 200 and the second shuttle 300 may be disposed in parallel along one mast portion 120. As a plurality of shuttles is disposed in parallel, the space occupied by the transfer apparatus may be relatively small.

The braking portion 266 may restrict movement of the first shuttle 200. In some embodiments, the braking portion 266, which is physically spaced apart from the base portion 121, may be brought into contact with the base portion 121 in accordance with driving thereof, thereby restricting movement of the first shuttle 200.

The second shuttle 300 may have a structure similar to the structure of the first shuttle 200 described with reference to FIGS. 5 to 8.

Referring to FIGS. 8 and 9, the pulley support portion 130 may include recesses 131. The recesses 131 may be defined as a sidewall of the pulley support portion 130 that is recessed. The first and second belts 510 and 520 supported by the belt-pulley structures 600 may be connected to respective shuttles 200 and 300 and respective counterweights 420 and 430 while extending through corresponding ones of the recesses 131, respectively.

The recesses 131, through which the first and second belts 510 and 520 do not extend, may be defined as preliminary recesses. When it is desired to install an additional shuttle and an additional counterweight, an additional belt and an additional belt-pulley structure may be installed to correspond to a preliminary recess and, as such, the additional shuttle and the additional counterweight may be installed. In the exemplary embodiments of the disclosure, the number of recesses 131 is not limited to that of the case shown above.

In the transfer apparatus according to the exemplary embodiments of the disclosure, attractive forces generated by linear motors may be offset each other and, as such, stability of vertical movement of a shuttle may be enhanced. Accordingly, the vertical movement speed of the shuttle may become relatively high.

In the transfer apparatus according to the exemplary embodiments of the disclosure, shuttles and counterweights may be disposed in parallel and, as such, the space occupied by the transfer apparatus may be relatively small.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A transfer apparatus comprising:
a mast portion comprising a base portion and a protrusion portion protruding from the base portion; and
a plurality of shuttles configured to move along the mast portion, thereby transferring a carrier,
wherein the mast portion comprises a first magnet track fixed to a first sidewall of the protrusion portion, a second magnet track fixed to a second sidewall of the protrusion portion, and a guide fixed to a third sidewall of the protrusion portion,
wherein the third sidewall of the protrusion portion is directly connected to each of the first and second sidewalls and forms an angle with respect to each of the first and second sidewalls,
wherein each of the plurality of shuttles comprises a first coil portion adjacent to the first magnet track in a horizontal direction, and a second coil portion adjacent to the second magnet track in the horizontal direction, and a guide block fixed to the shuttle and engaging with the guide, and
wherein the protrusion portion, the first magnet track, and the second magnet track are disposed between the first and second coil portions.

2. The transfer apparatus according to claim 1, wherein a distance between the first magnet track and the first coil portion and a distance between the second magnet track and the second coil portion are maintained to be constant while each of the plurality of shuttles moves.

3. The transfer apparatus according to claim 1, wherein:
each of the plurality of shuttles further comprises a shuttle frame; and
the first and second coil portions are fixed to a first sidewall of the shuttle frame.

4. The transfer apparatus according to claim 3,
wherein the guide block is fixed to the shuttle frame of the shuttle.

5. The transfer apparatus according to claim 1, wherein:
the plurality of shuttles comprises a first shuttle and a second shuttle, and
the transfer apparatus further comprises:
a first belt coupled to the first shuttle, and
a second belt coupled to the second shuttle while extending through the first shuttle.

6. The transfer apparatus according to claim 5, further comprising:
belt-pulley structures supporting the first and second belts.

7. The transfer apparatus according to claim 5, further comprising:
a first counterweight coupled to the first belt; and
a second counterweight coupled to the second belt.

8. A transfer apparatus comprising:
a mast portion;
a first shuttle and a second shuttle configured to move along the mast portion, thereby transferring a carrier;
a first belt coupled to the first shuttle, to move together with the first shuttle; and
a second belt coupled to the second shuttle while extending through the first shuttle, to move together with the second shuttle,
wherein the first shuttle comprises a belt through hole through which the second belt extends,
wherein the mast portion comprises a base portion, a protrusion portion protruding from the base portion, a guide fixed to the protrusion portion, and magnet tracks disposed at opposite sides of the protrusion portion,
wherein each of the first and second shuttles comprises coil portions spaced apart from each other with the magnet tracks disposed therebetween, and
wherein each of the first and second shuttles comprises a guide block engaging with the guide.

9. The transfer apparatus according to claim 8, wherein the first shuttle comprises belt guide rollers guiding the second belt.

10. The transfer apparatus according to claim 8, wherein the first shuttle surrounds a portion of the second belt.

11. The transfer apparatus according to claim 8, further comprising:
a pulley support portion on the mast portion; and
belt-pulley structures on the pulley support portion,
wherein the first and second belts are supported by the belt-pulley structures.

12. The transfer apparatus according to claim 8, wherein the first shuttle comprises a belt clamp configured to clamp the first belt.

13. A transfer apparatus comprising:
a mast portion comprising a base portion, a protrusion portion protruding from a first sidewall of the base portion, and a guide fixed to a third sidewall of the protrusion portion, the third sidewall of the protrusion portion being directly connected to each of first and second sidewalls of the protrusion portion and forming an angle with respect to each of the first and second sidewalls of the protrusion portion;
a first shuttle comprising a first guide block fixed to the first shuttle and engaging with the guide and a second shuttle comprising a second guide block fixed to the second shuttle and engaging with the guide, each of the first and second shuttle configured to move along the first sidewall of the base portion, thereby transferring a carrier;
a first counterweight and a second counterweight configured to move along a second sidewall of the base portion;
a first belt interconnecting the first shuttle and the first counterweight; and
a second belt interconnecting the second shuttle and the second counterweight,
wherein the first and second shuttles overlap each other in a vertical direction, and
wherein the first and second counterweights are spaced apart from each other in a horizontal direction.

14. The transfer apparatus according to claim 13, wherein:
the mast portion comprises a first magnet track fixed to a first sidewall of the protrusion portion, and a second magnet track fixed to a second sidewall of the protrusion portion; and
the first and second sidewalls of the protrusion portion are parallel to each other.

15. The transfer apparatus according to claim 14, wherein:
the first shuttle comprises a first coil portion adjacent to the first magnet track, and a second coil portion adjacent to the second magnet track; and
the first and second magnet tracks are disposed between the first and second coil portions.

16. The transfer apparatus according to claim 13, wherein the second belt extends through the first shuttle.

17. The transfer apparatus according to claim 16, wherein the first shuttle comprises a belt through hole through which the second belt extends.

18. The transfer apparatus according to claim 13, wherein:
the mast portion comprises a power cable disposed on the first sidewall of the base portion; and
each of the first and second shuttles comprises a pick-up portion configured to receive electric power from the power cable in a wireless manner.

* * * * *